US012598757B2

(12) United States Patent
Tsai et al.

(10) Patent No.: US 12,598,757 B2
(45) Date of Patent: *Apr. 7, 2026

(54) STRUCTURE AND FORMATION METHOD OF PACKAGE WITH HYBRID INTERCONNECTION

(71) Applicant: Taiwan Semiconductor Manufacturing Company, Ltd., Hsinchu (TW)

(72) Inventors: Tsung-Fu Tsai, Changhua County (TW); Szu-Wei Lu, Hsinchu City (TW); Shih-Peng Tai, Xinpu Township (TW); Chen-Hua Yu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 542 days.

This patent is subject to a terminal disclaimer.

(21) Appl. No.: 18/163,412

(22) Filed: Feb. 2, 2023

(65) Prior Publication Data

US 2024/0114703 A1 Apr. 4, 2024

Related U.S. Application Data

(60) Provisional application No. 63/378,091, filed on Oct. 3, 2022.

(51) Int. Cl.
*H01L 23/48* (2006.01)
*H01L 21/56* (2006.01)
(Continued)

(52) U.S. Cl.
CPC ............. *H10B 80/00* (2023.02); *H01L 21/56* (2013.01); *H01L 21/76898* (2013.01);
(Continued)

(58) Field of Classification Search
CPC ........... H01L 2924/181; H01L 25/0657; H01L 2924/15311; H01L 2224/73265; H01L 24/73; H01L 2224/48227; H01L 2224/16225; H01L 23/49816; H01L 2924/014; H01L 24/05; H01L 24/81; H01L 24/08; H01L 2225/06541;
(Continued)

(56) References Cited

U.S. PATENT DOCUMENTS 8,993,380 B2   3/2015   Hou et al.
9,281,254 B2   3/2016   Yu et al.
(Continued)

*Primary Examiner* — Niki H Nguyen
(74) *Attorney, Agent, or Firm* — McClure, Qualey & Rodack, LLP

(57) ABSTRACT

A package structure and a formation method are provided. The method includes providing a semiconductor substrate and bonding a first chip structure on the semiconductor substrate through metal-to-metal bonding and dielectric-to-dielectric bonding. The method also includes bonding a second chip structure over the semiconductor substrate through solder-containing bonding structures. The method further includes forming a protective layer surrounding the second chip structure. A portion of the protective layer is between the semiconductor substrate and a bottom of the second chip structure.

20 Claims, 13 Drawing Sheets

(51) Int. Cl.

| | |
|---|---|
| *H01L 21/768* | (2006.01) |
| *H01L 23/00* | (2006.01) |
| *H01L 23/31* | (2006.01) |
| *H01L 23/52* | (2006.01) |
| *H01L 29/40* | (2006.01) |
| *H10B 80/00* | (2023.01) |

(52) U.S. Cl.
CPC ........ *H01L 23/3128* (2013.01); *H01L 23/481* (2013.01); *H01L 24/08* (2013.01); *H01L 24/16* (2013.01); *H01L 24/32* (2013.01); *H01L 24/73* (2013.01); *H01L 24/80* (2013.01); *H01L 24/92* (2013.01); *H01L 2224/08145* (2013.01); *H01L 2224/16145* (2013.01); *H01L 2224/32145* (2013.01); *H01L 2224/73204* (2013.01); *H01L 2224/80895* (2013.01); *H01L 2224/80896* (2013.01); *H01L 2224/92125* (2013.01)

(58) Field of Classification Search
CPC . H01L 2224/73204; H01L 2224/32145; H01L 24/13; H01L 2224/16145; H01L 2224/08145; H01L 21/56; H01L 25/0655; H01L 2225/06517; H01L 2224/04105; H01L 24/06; H01L 2224/12105; H01L 23/3107; H01L 24/17; H01L 2224/04042; H01L 2924/3025; H01L 23/3135; H01L 2224/81191; H01L 2225/06562; H01L 2224/08146; H01L 23/5226; H01L 2224/16238; H01L 24/14; H01L 24/02; H01L 2924/15192; H01L 25/072; H01L 2224/96; H01L 2224/13025; H01L 2224/48145; H01L 2224/16237; H01L 2224/84801; H01L 2224/08; H01L 2225/06555; H01L 2224/13022; H01L 2224/73203; H01L 2224/1403; H01L 21/76898; H01L 23/3128; H01L 23/481; H01L 24/32; H01L 24/80; H01L 24/92; H01L 2224/80895; H01L 2224/80896; H01L 2224/92125; H10B 80/00
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,559,081 B1* | 1/2017 | Lai ...................... | H01L 21/6835 |
| 9,666,502 B2 | 5/2017 | Chen et al. | |
| 9,735,131 B2 | 8/2017 | Su et al. | |
| 9,899,281 B2* | 2/2018 | Shen ....................... | H01L 25/50 |
| 10,565,633 B2* | 2/2020 | Ranganath ......... | G06Q 30/0619 |
| 2019/0348386 A1* | 11/2019 | Huang .................. | H01L 21/565 |
| 2023/0335519 A1* | 10/2023 | Chen ................... | H01L 25/0655 |

* cited by examiner

STRUCTURE AND FORMATION METHOD OF PACKAGE WITH HYBRID INTERCONNECTION

PRIORITY CLAIM AND CROSS-REFERENCE

This application claims the benefit of U.S. Provisional Application No. 63/378,091, filed on Oct. 3, 2022, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
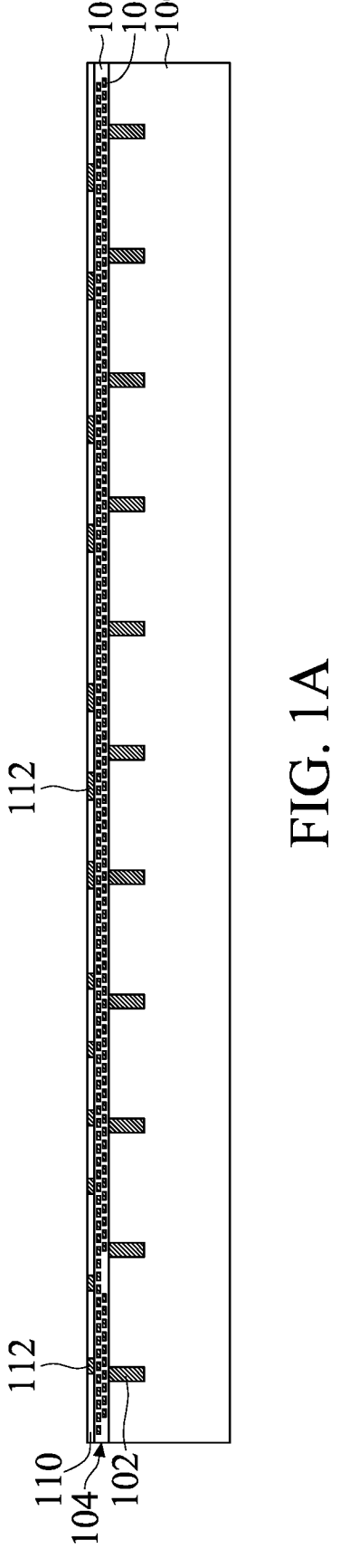
FIGS. 1A-1K are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows the testing through probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1K are cross-sectional views of various stages of a process for forming a package structure, in accordance with some embodiments. As shown in FIG. 1A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, multiple conductive structures 102 are formed in the semiconductor substrate 100, as shown in FIG. 1A. In some embodiments, insulating layers are formed between the conductive structures 102 and the semiconductor substrate 100, so as to prevent short circuiting between the conductive structures 102. The conductive structures 102 may function as through substrate vias (TSVs). The conductive structures 102 may be made of or include copper, aluminum, tungsten, cobalt, gold, ruthenium, one or more other suitable materials, or a combination thereof. The insulating layers may be made of or include silicon oxide, silicon nitride, silicon oxynitride, one or more other suitable materials, or a combination thereof.

In some embodiments, the semiconductor substrate 100 is partially removed to form multiple holes that are used to contain the conductive structures 102 and the insulating layers. One or more photolithography processes and one or more etching processes are used to form the holes. Afterwards, an insulating material layer is deposited over the semiconductor substrate 100. The insulating material layer extends along the sidewalls and bottoms of the holes. The insulating material layer may be deposited using a chemical vapor deposition (CVD) process, an atomic layer deposition (ALD) process, an oxidation process, one or more other applicable processes, or a combination thereof.

In some embodiments, a conductive material layer is then deposited over the insulating material layer. The conductive material layer may overfill the holes. The conductive material layer may be deposited using a CVD process, a physical vapor deposition (PVD) process, an ALD process, an electrochemical plating process, one or more other applicable processes, or a combination thereof.

Afterwards, a planarization process is used to remove the excess portions of the insulating material layer and the conductive material layer that are outside of the holes. As a result, the remaining portions of the insulating material layer form the insulating layers, and the remaining portions of the conductive material layer form the conductive structures 102. The planarization process may include a chemical mechanical polishing (CMP) process, a grinding process, an etching process, a dry polishing process, one or more other applicable processes, or a combination thereof.

In some embodiments, an interconnection structure 104 is formed over the semiconductor substrate 100 and the conductive structures 102, as shown in FIG. 1A. The semiconductor substrate 100 and the interconnection structure 104 may together be used as a semiconductor interposer substrate. The interconnection structure 104 includes multiple dielectric layers 106 and multiple conductive features 108 surrounded by the dielectric layers 106. The interconnection structure 104 also includes a dielectric layer 110 that surround multiple conductive features 112, as shown in FIG. 1A. The dielectric layer 110 may be the topmost dielectric layer of the interconnection structure 104.

The dielectric layer 110 may be made of or include silicon oxide, silicon oxynitride, silicon nitride, silicon carbide, carbon-containing silicon nitride, carbon-containing silicon oxynitride, one or more other suitable materials, or a combination thereof. The conductive features 112 may include conductive pads. The conductive features 112 may be made of or include copper, gold, cobalt, aluminum, tungsten, ruthenium, one or more other suitable materials, or a combination thereof.

In some embodiments, the top surfaces of the conductive features 112 and the dielectric layer 110 are substantially level or substantially planar. A CMP process may be performed to ensure high degree of flatness of the top surfaces of the conductive features 112 and the dielectric layer 110. The formation of the interconnection structure 104 may involve multiple deposition processes, multiple etching processes, and multiple planarization processes.

Figure 1B:
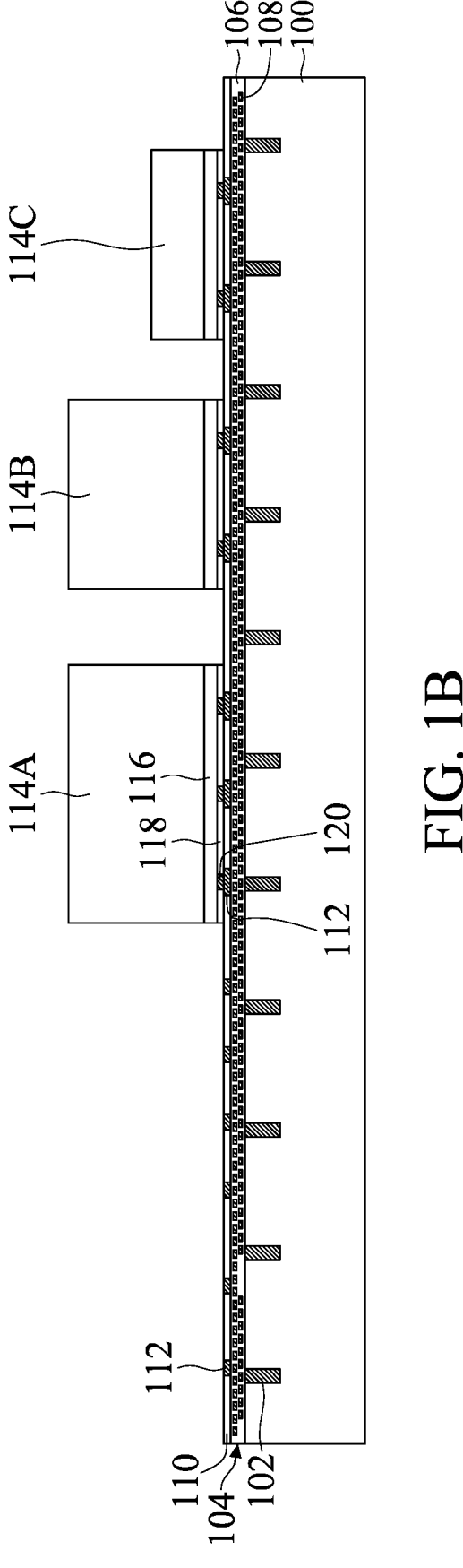

As shown in FIG. 1B, multiple chip structures (or chip-containing structures) 114A, 114B, and 114C are disposed over the semiconductor substrate 100, in accordance with some embodiments. In some embodiments, the chip structures 114A-114C are bonded to the interconnection structure 104. In some embodiments, the chip structures 114A-114C are bonded to the interconnection structure 104 through direct bonding that include metal-to-metal bonding and dielectric-to-dielectric bonding. In some embodiments, the heights of the chip structures 114A-114C are the same. In some other embodiments, the chip structures 114A-114C have different heights. In some embodiments, the chip structure 114C is shorter than the chip structures 114A or 114B, as shown in FIG. 1B.

Each of the chip structures 114A-114C may be a single semiconductor die and/or system-on-integrated-chips (SoIC). For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, one or more of the chip structures 114A-114C include high-frequency devices, optoelectronic devices, photonic devices, logic devices, memory devices, one or more other suitable devices, or a combination thereof.

In some embodiments, each of the chip structures 114A-114C has an interconnection structure 116. The interconnection structure 116 is used to provide electrical connection between devices formed within each of the chip structures 114A-114C. The interconnection structure 116 further includes multiple conductive features 120 that are laterally surrounded by a dielectric layer 118. In some embodiments, the surfaces of the conductive features 120 and the dielectric layer 118 are substantially level. Before bonding the chip structures 114A-114C to the interconnection structure 104, a CMP process may be used to ensure the surfaces of the conductive features 120 and the dielectric layer 118 have high degree of flatness.

The dielectric layer 118 may be made of or include silicon oxide, silicon oxynitride, silicon nitride, silicon carbide, carbon-containing silicon nitride, carbon-containing silicon oxynitride, one or more other suitable materials, or a combination thereof. The conductive features 120 may include conductive pads. The conductive features 120 may be made of or include copper, gold, cobalt, aluminum, tungsten, ruthenium, one or more other suitable materials, or a combination thereof.

In some embodiments, the chip structures 114A-114C are placed directly on the interconnection structure 104. As a result, the dielectric layers 118 of the chip structures 114A-114C are in direct contact with the dielectric layer 110. The conductive features 120 of the chip structures 114A-114C are in direct contact with the conductive features 112. In some embodiments, there is no gap between the dielectric layers 118 and 110. In some embodiments, there is no gap between the conductive features 112 and 120. In some embodiments, a thermal operation is then used to enhance the bonding between the conductive features 120 and 112. The temperature of the thermal operation may within a range from about 100 degrees C. to about 700 degrees C.

Figure 1C:
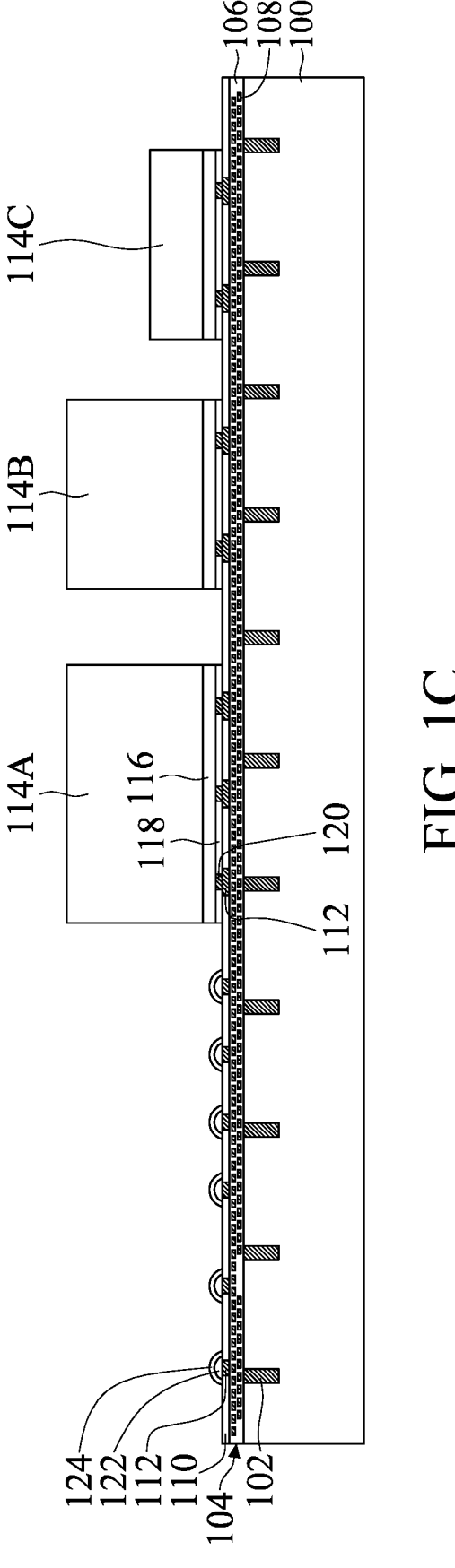

As shown in FIG. 1C, multiple conductive elements 122 and 124 are formed over the conductive features 112 that are not bonded to the chip structures 114A-114C, in accordance with some embodiments. In some embodiments, the conductive elements 122 and 124 are selectively formed on the surfaces of the conductive features 122. In some embodiments, the conductive elements 122 and 124 are formed using an electrochemical plating process. The conductive elements 122 and 124 may together function as under bump metallization (UBM) structures. The UBM structures may be made of or include electroless copper, electroless nickel electroless palladium immersion gold (ENEPIG), electroless copper and tin, one or more other suitable materials, or a combination thereof. The formation of the UBM structure may involve an electroless plating process, an immersion plating process, one or more other applicable processes, or a combination thereof.

Figure 1D:
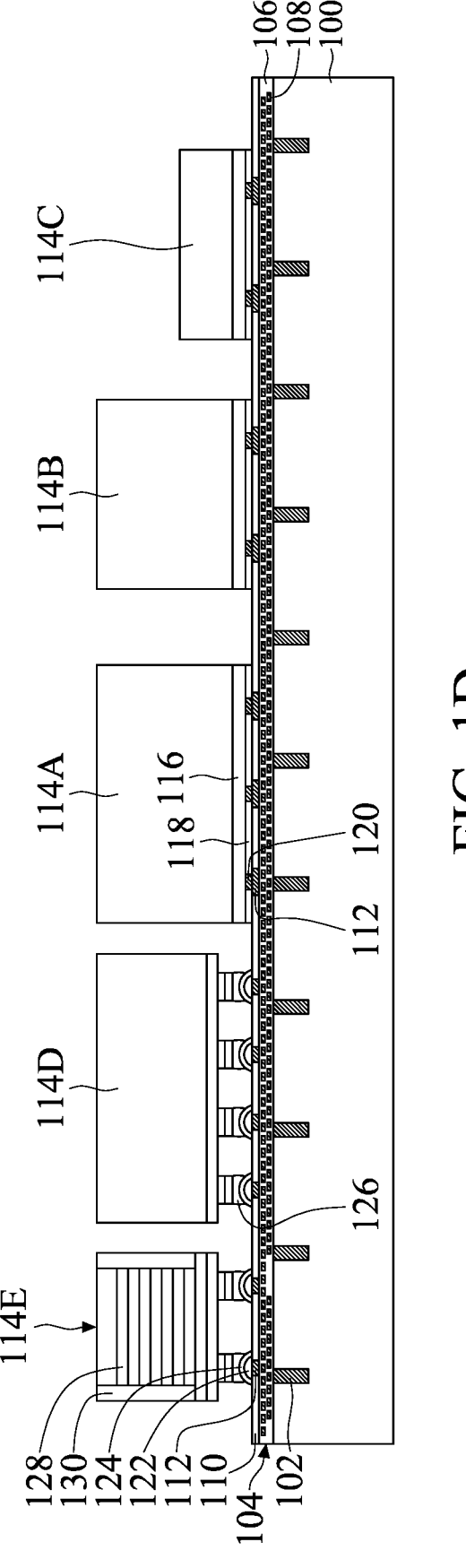

As shown in FIG. 1D, chip structures (or chip-containing structures) 114D and 114E are bonded to the interconnection structure 104 through conductive bumps 126, in accordance with some embodiments. In some embodiments, the conductive bumps 126 are micro-bumps. Due to the conductive bumps 126, the chip structures 114D and 114E are separated from the interconnection structure 104. The front sides of the chip structures (i.e., the sides where the conductive bumps 126 are located) are positioned at a higher height level than the front sides of the chip structures 114A-114C. There is a gap between the interconnection structure 104 and the chip structures 114D or 114E.

In some embodiments, the conductive bumps 126 contain a solder material. The solder material may be a tin-containing material. The tin-containing material may further include copper, silver, gold, aluminum, lead, one or more other suitable materials, or a combination thereof. In some other embodiments, the solder material is lead-free. The conductive bumps 126 may further include conductive pillars formed on the chip structures 114D and 114E. The conductive pillars may be made of or include copper. The conductive bumps 126, the conductive pillars, and the UBM structures (i.e., the conductive elements 122 and 124) may together form tin-containing bonding structures between the interconnection structure 104 and the chip structures 114D and 114E.

The chip structures 114D may be a single semiconductor die or system-on-integrated-chips (SoIC). For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, the chip structure 114D include logic devices, memory devices, one or more other suitable devices, or a combination thereof.

In some embodiments, the chip structure 114E includes multiple semiconductor dies that are stacked and bonded together. As shown in FIG. 1D, the chip structure 114E includes multiple semiconductor dies 128. In some embodiments, the chip structure 114E includes a molding layer 130 that encapsulates and protects these semiconductor dies. The molding layer 130 may include an epoxy-based resin with fillers dispersed therein. The fillers may include insulating fibers, insulating particles, one or more other suitable elements, or a combination thereof. In some embodiments, the chip structure 114E is a package that includes a stack of multiple semiconductor dies.

In some embodiments, the semiconductor dies 128 are memory dies. The memory dies may include memory devices such as static random access memory (SRAM) devices, dynamic random access memory (DRAM) devices, one or more other suitable devices, or a combination thereof. In some embodiments, the chip structure 114E also includes a semiconductor die that functions a control die. The chip structure 114E may be used as a high bandwidth memory (HBM).

Figure 1E:
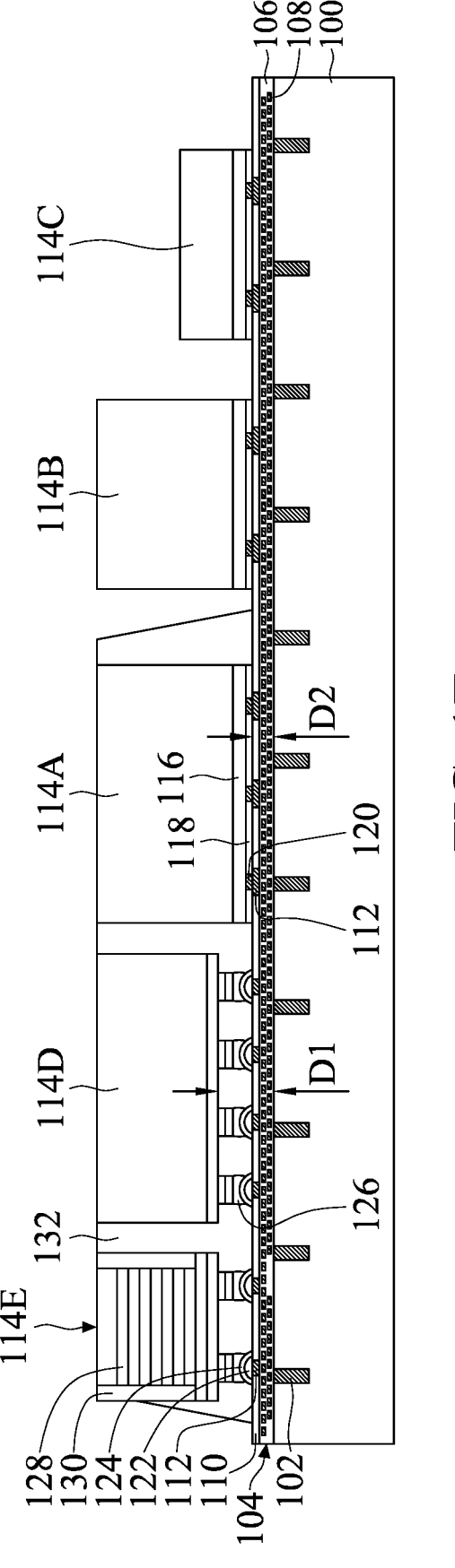

As shown in FIG. 1E, a protective layer 132 is formed over the semiconductor substrate 100, in accordance with some embodiments. The protective layer 132 may function as an underfill structure. In some embodiments, the protective layer 132 surrounds the chip structures 114A, 114D, and 114E. The protective layer 132 laterally surrounds and protects the bonding structures (including the conductive bumps 126 and the UBM structures) between the interconnection structure 104 and the chip structures 114D and 114E. In some embodiments, the protective layer 132 extends along the sidewalls of the chip structures 114A, 114D, and 114E. In some embodiments, the protective layer 132 does not reach the chip structures 114B and 114C. The protective layer 132 is separated from the chip structures 114B and 114C.

As shown in FIG. 1E, the bottom surface (or the front side) of the chip structure 114D is separated from the semiconductor substrate 100 by a distance D1, and the bottom surface (or the front side) of the chip structure 114A is separated from the semiconductor substrate 100 by a distance D2. The bottom surface of the chip structure 114A is closer to the semiconductor substrate 100 than the bottom surface of the chip structure 114D. In some embodiments, a first portion of the protective layer 132 is vertically disposed between the interconnection structure 104 and the chip structure 114D, as shown in FIG. 1E. Similarly, in some embodiments, a second portion of the protective layer 132 is vertically between the interconnection structure 104 and the chip structure 114E, as shown in FIG. 1E. In some embodiments, the protective layer 132 does not extend between the chip structure 114A and the interconnection structure 104.

In some embodiments, the protective layer 132 is made of or includes a polymer material, such as an epoxy-based resin with fillers dispersed therein. The fillers may include fibers (such as silica fibers and/or carbon-containing fibers), particles (such as silica particles and/or carbon-containing particles), or a combination thereof.

In some embodiments, an underfill liquid is dispensed onto the interconnection structure 104 along a side of the chip structure 114E. The underfill liquid may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill liquid may be drawn into the space between the interconnection structure 104 and the chip structures 114D and 11E to surround the conductive bumps 126 by the capillary force. Due to the capillary force, the underfill liquid may extend upwards along the sidewalls of the chip structures 114A, 114D, and 114E. Afterwards, a thermal operation may be used to cure the underfill liquid. As a result, the protective layer 132 is formed.

Figure 1F:
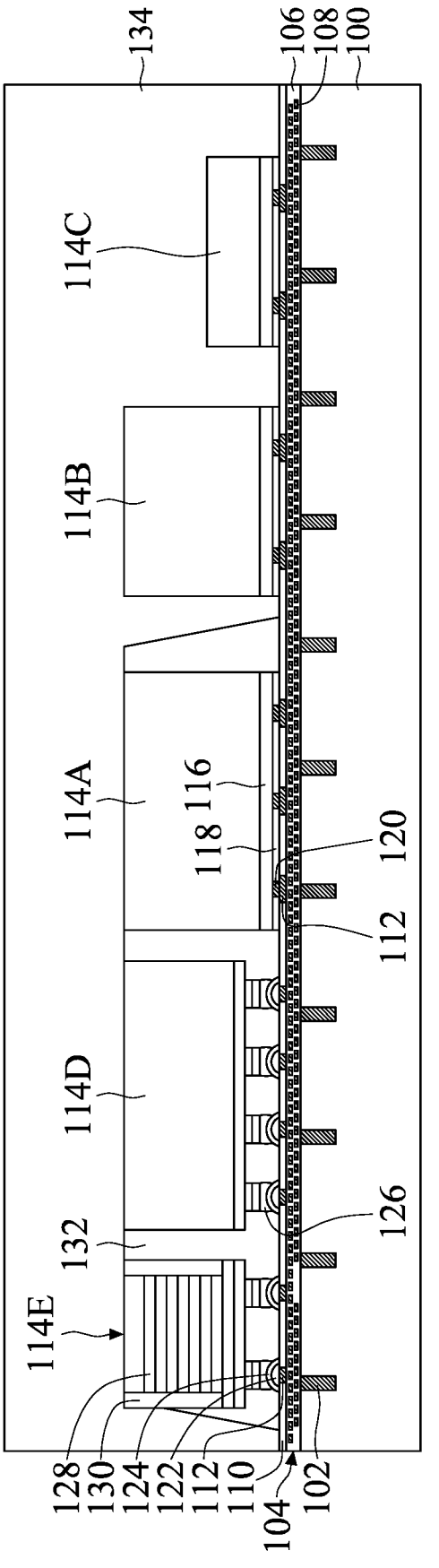

As shown in FIG. 1F, an encapsulant layer 134 is formed over the semiconductor substrate 100, in accordance with some embodiments. The encapsulant layer 134 surrounds the protective layer 132 and the chip structures 114A-114E. In some embodiments, the protective layer 132 is separated from the chip structure 114B and 114C by a portion of the encapsulant layer 134. In some embodiments, the encapsulant layer 134 covers the top surfaces of the chip structures 114A-114E.

The encapsulant layer 134 may be made of or include a polymer-containing material. In some embodiments, the encapsulant layer 134 is a molding compound layer. The molding compound layer may include an epoxy-based resin with fillers dispersed therein. The fillers may include insulating fibers, insulating particles, other suitable elements, or a combination thereof. In some embodiments, the size and/or density of the fillers dispersed in the encapsulant layer 134 is greater than those dispersed in the protective layer 132.

In some embodiments, a liquid molding compound material is applied, and a thermal operation is then applied to cure the liquid molding compound material. As a result, the liquid molding compound material is hardened and transformed into the encapsulant layer 134. In some embodiments, the thermal operation is performed at a temperature that is within a range from about 200 degrees C. to about 230 degrees C. The operation time of the thermal operation may be within a range from about 1 hour to about 3 hours.

Figure 1G:
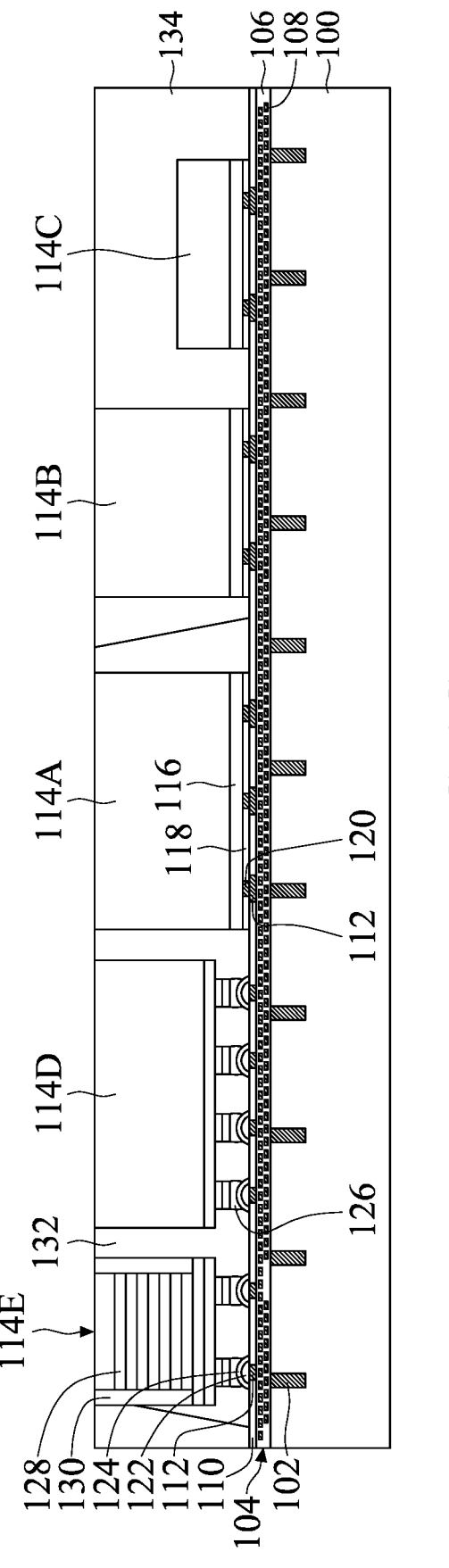

As shown in FIG. 1G, the encapsulant layer 134 is thinned, in accordance with some embodiments. As a result, one or more of the chip structures 114A-114E are exposed. In some embodiments, the top surfaces of the chip structures 114A, 114B, 114D, and 114E are exposed after the thinning of the encapsulant layer 134, as shown in FIG. 1G. The encapsulant layer 134 may be thinned using a grinding process, a CMP process, an etching process, a dry polishing process, one or more other applicable processes, or a combination thereof.

Figure 1H:
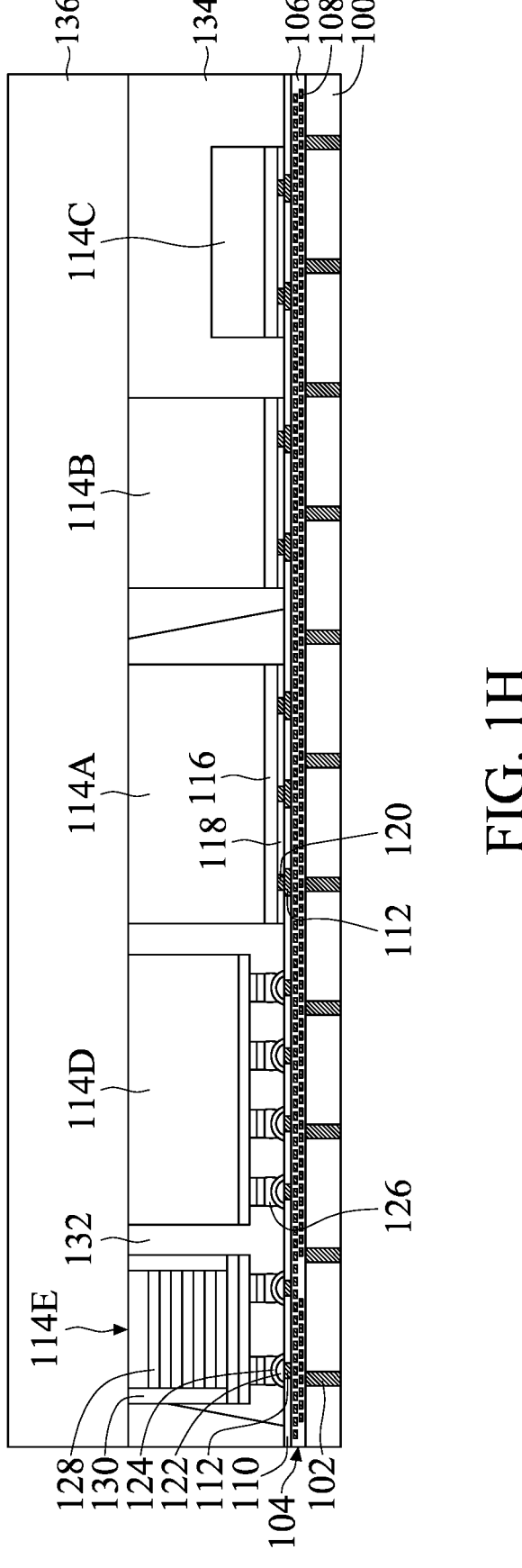

As shown in FIG. 1H, a carrier substrate 136 is attached to the top surfaces of the encapsulant layer 134 and the chip structures 114A, 114B, 114D, and 114E, in accordance with some embodiments. The carrier substrate 136 may be a semiconductor wafer (such as a silicon wafer), a glass wafer, or the like. The carrier substrate 136 may be attached using an adhesive tape.

Afterwards, the structure is turned upside down, and the semiconductor substrate 100 is thinned. As a result, the conductive structures 102 are exposed, as shown in FIG. 1H in accordance with some embodiments. The conductive structures may be used as through substrate vias. The semiconductor substrate 100 may be thinned using a CMP process, a grinding process, an etching process, one or more other applicable processes, or a combination thereof.

Figure 1I:
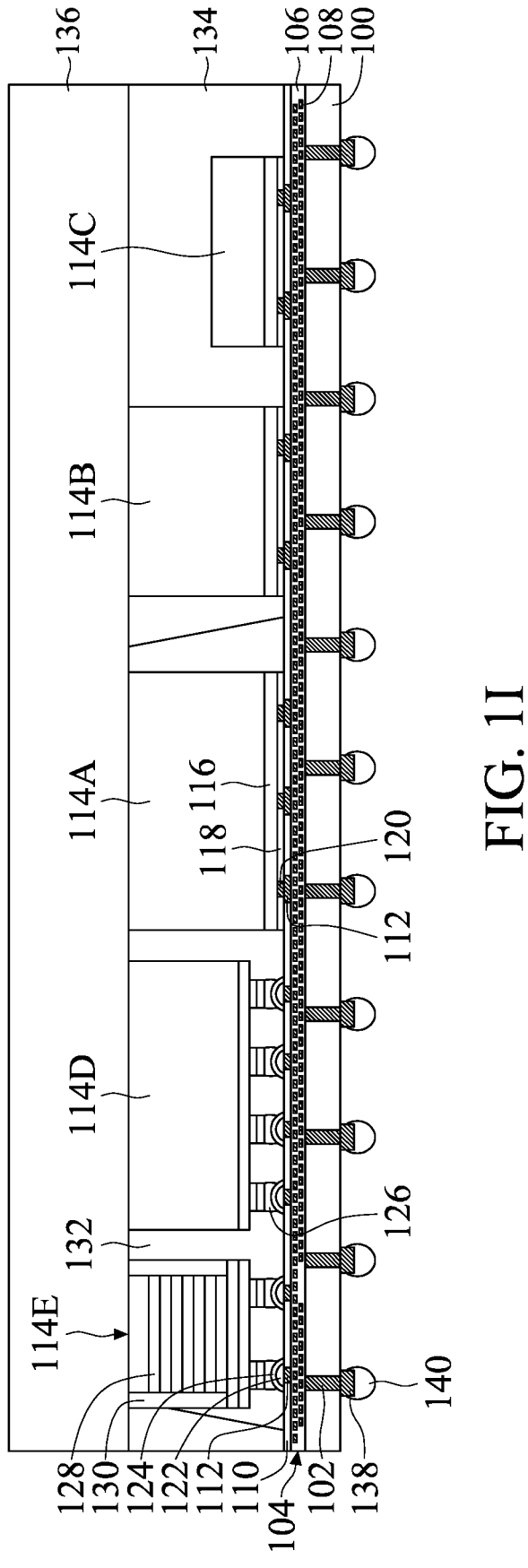

As shown in FIG. 1I, conductive elements are formed over the semiconductor substrate 100, in accordance with some embodiments. In some embodiments, the conductive elements include conductive pillars 138 and conductive connectors 140. The conductive connectors 140 may include solder bumps. The conductive pillars 138 may be made of or include copper, gold, cobalt, aluminum, one or more other suitable materials, or a combination thereof. In some embodiments, each of the conductive pillars 138 is electrically connected to one of the conductive structures 102. However, many variations and/or modifications can be made to embodiments of the disclosure. In some other embodiments, the conductive elements have different structures. For example, the conductive elements do not include conductive pillars. The conductive elements may only include solder bumps. In some embodiments, a buffer layer is formed to protect the conductive elements. The buffer layer may be made of or include silicon nitride, silicon oxynitride, silicon oxide, polyimide, epoxy resin, polybenzoxazole (PBO), another suitable material, or a combination thereof.

Figure 1J:
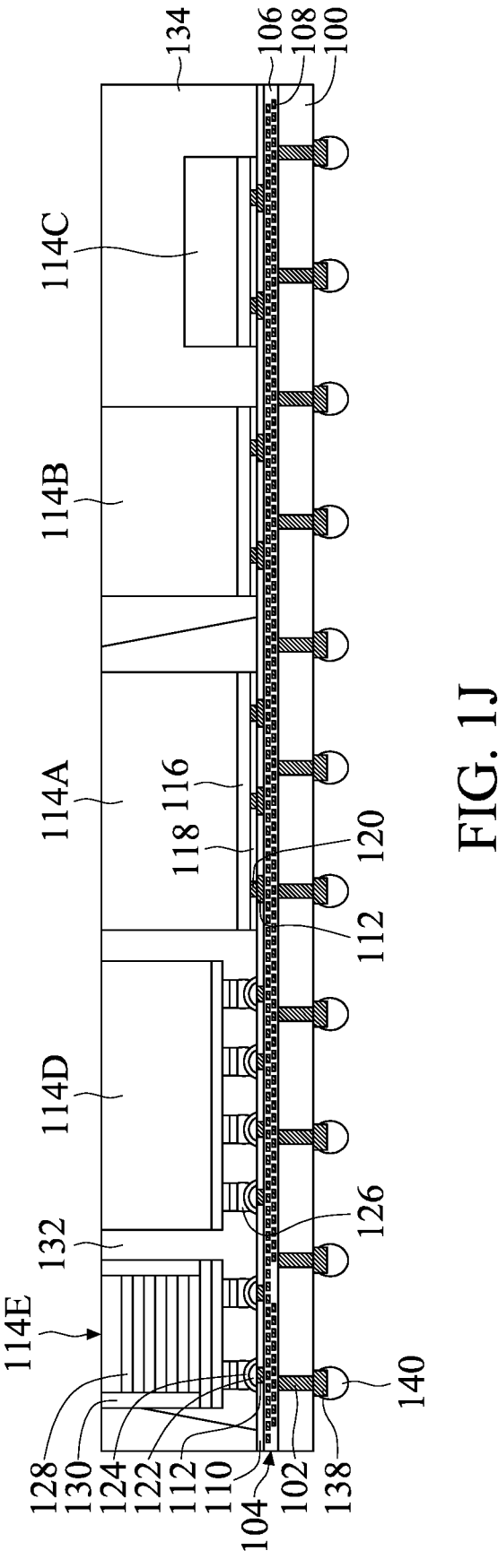

Afterwards, the carrier substrate 136 is removed, as shown in FIG. 1J in accordance with some embodiments. The encapsulant layer 134, the protective layer 132, and some of the chip structures 114A-114E are exposed, as shown in FIG. 1J.

Figure 1K:
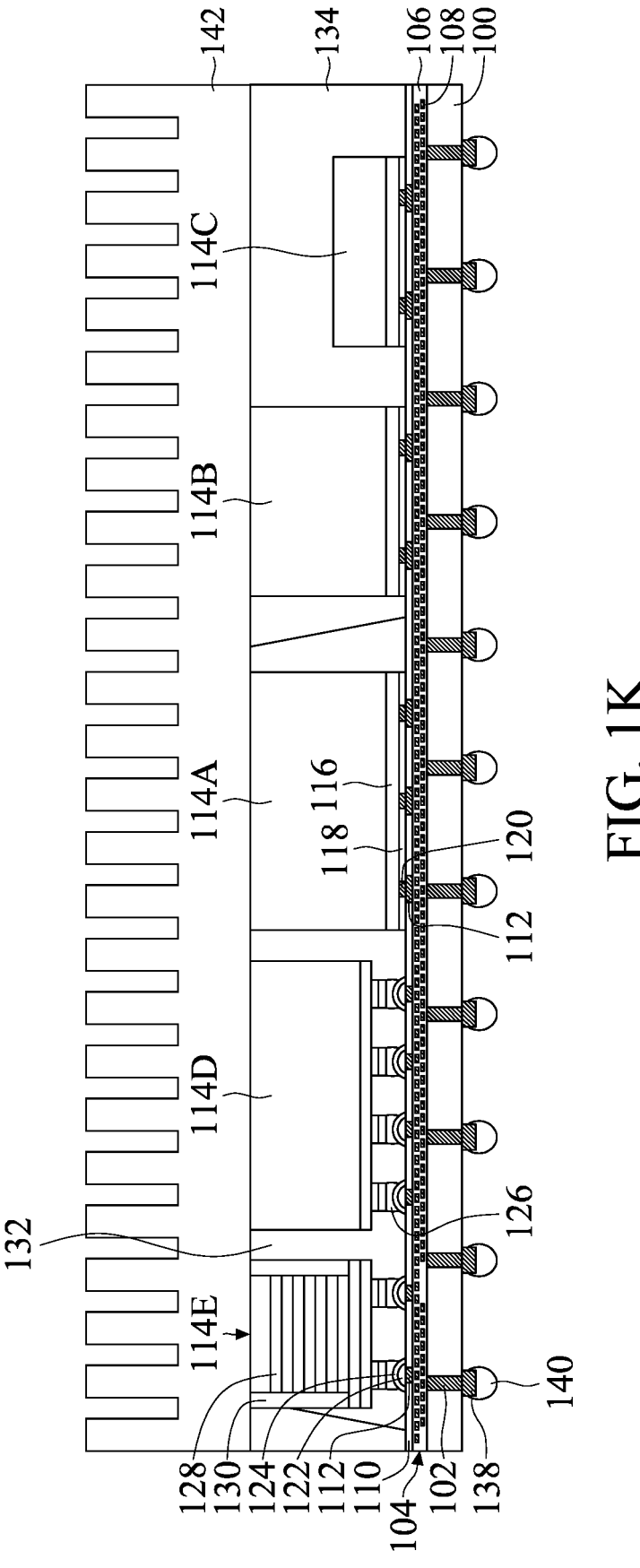

As shown in FIG. 1K, a thermal conductive structure 142 is disposed over the structure shown in FIG. 1J, in accordance with some embodiments. The thermal conductive structure 142 may function as a heat sink that help to improve the heat dissipation of the chip structures 114A-114E. The operation and reliability of the package structure may thus be improved. The thermal conductive structure 142 may be made of or include copper, gold, steel, silver, one or more other suitable materials, or a combination thereof. The thermal conductive structure 142 may be attached to the structure shown in FIG. 1J using an adhesive tape, a glue material, or the like.

In some embodiments, the semiconductor substrate 100 is free of active devices. There is no active device such as transistors formed in the semiconductor substrate 100. However, embodiments of the disclosure are not limited thereto. Many variations and/or modifications can be made to embodiments of the disclosure.

Figure 2:
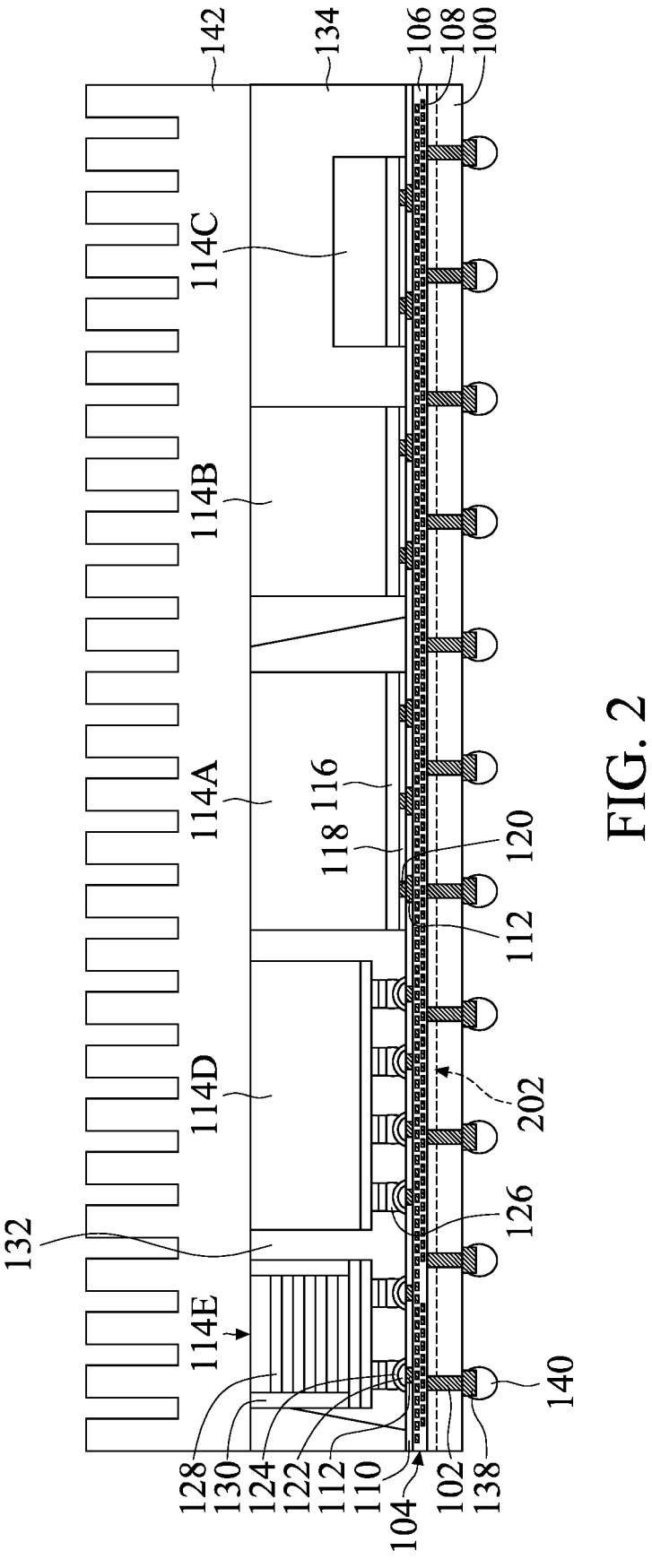
FIG. 2 is a cross-sectional view of an intermediate stage of a process for forming a package structure, in accordance with some embodiments.

FIG. 2 is a cross-sectional view of an intermediate stage of a process for forming a package structure, in accordance with some embodiments. In some embodiments, there are active devices formed in the semiconductor substrate 100. As shown in FIG. 2, device regions 202 are formed in the semiconductor substrate 100. In some embodiments, active devices such as transistors are formed in the device regions 202.

Figure 3:
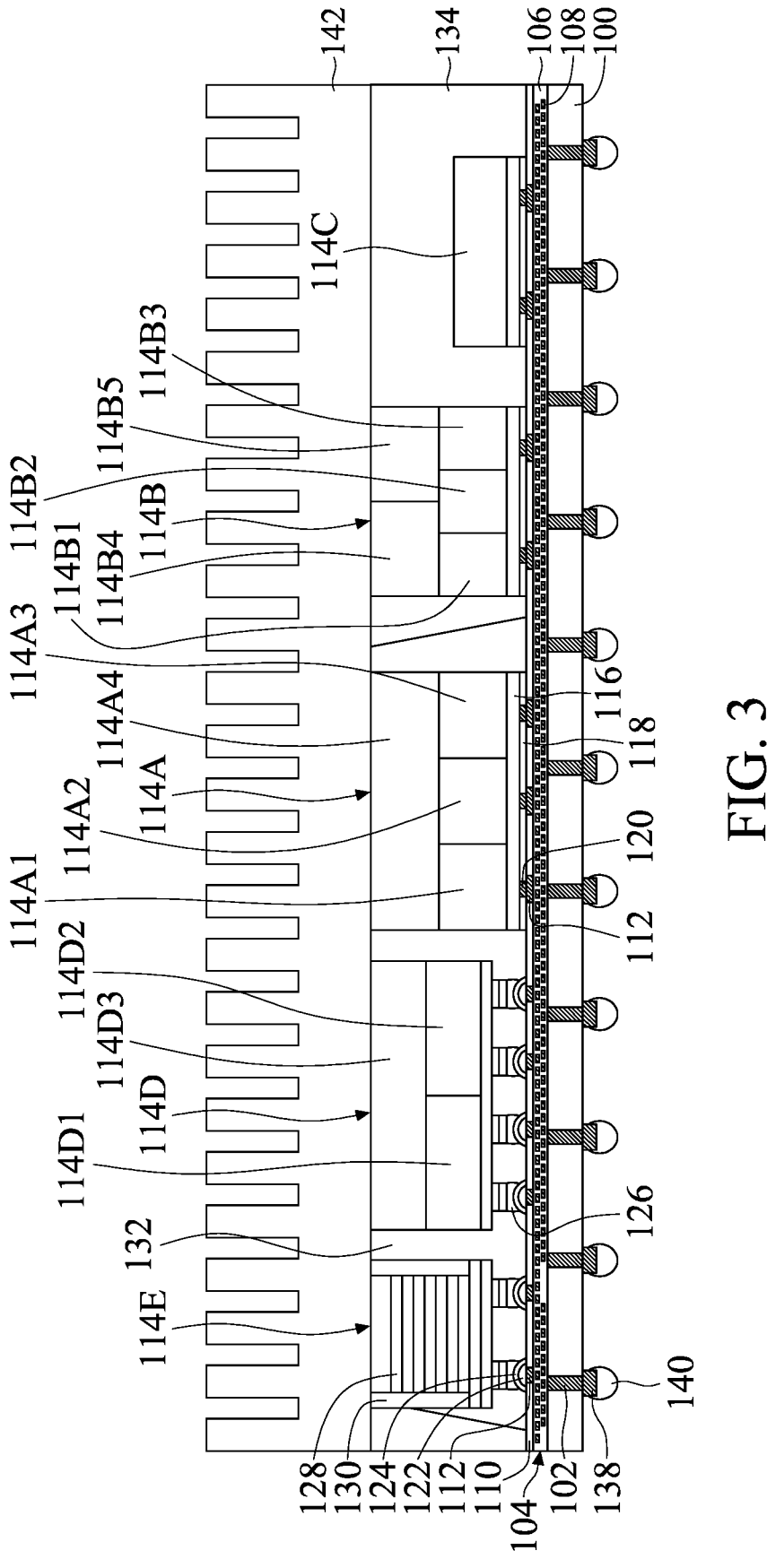
FIG. 3 is a cross-sectional view of an intermediate stage of a process for forming a package structure, in accordance with some embodiments.

FIG. 3 is a cross-sectional view of an intermediate stage of a process for forming a package structure, in accordance with some embodiments. As mentioned above, one or more of the chip structures 114A-114E may be system-on-integrated-chips (SoIC) that include multiple semiconductor dies that are bonded together. The bonding between these semiconductor dies may be direct bonding that includes dielectric-to-dielectric bonding and metal-to-metal bonding. Some of the semiconductor dies may include through die vias that form vertical electrical connections between the stacked semiconductor dies.

In some embodiments, the chip structure 114D includes semiconductor dies 114D1, 114D2, and 114D3 that are direct bonded together. In some embodiments, the semiconductor die 114D3 extends across opposite edges of the semiconductor dies 114D1 and 114D2 thereunder. Similarly, in some embodiments, the chip structure 114A includes multiple semiconductor dies 114A1-114A4 that are bonded and stacked together, and the chip structures 114B includes semiconductor dies 114B1-114B5 that are bonded and stacked together. The chip structures may further include one or more dielectric layers that surround the bonded semiconductor dies. One or more through dielectric vias may be formed in the one or more dielectric layers.

Embodiments of the disclosure form a package structure that includes an interposer substrate with multiple chip structures bonded thereon. Some of the chip structures are bonded to the interposer substrate through dielectric-to-dielectric bonding and metal-to-metal bonding. Some of the chip structures are bonded to the interposer substrate through the use of solder-containing bonding structures. The bonding of the chip structures that involve the dielectric-to-dielectric bonding and metal-to-metal bonding is performed before the bonding of the chip structures that involve the solder-containing bonding structures. Therefore, the bonding surfaces may be kept clean and planar, which facilitates the dielectric-to-dielectric bonding and metal-to-metal bonding. The quality and reliability of the package structure are ensured.

In accordance with some embodiments, a method for forming a package structure is provided. The method includes providing a semiconductor substrate and bonding a first chip structure on the semiconductor substrate through metal-to-metal bonding and dielectric-to-dielectric bonding. The method also includes bonding a second chip structure over the semiconductor substrate through solder-containing bonding structures. The method further includes forming a protective layer surrounding the second chip structure. A portion of the protective layer is between the semiconductor substrate and a bottom of the second chip structure.

In accordance with some embodiments, a method for forming a package structure is provided. The method includes providing a semiconductor substrate with an interconnection structure and bonding a first chip structure directly on interconnection structure of the semiconductor substrate. The method also includes bonding a second chip structure over the interconnection structure of the semiconductor substrate. A first bottom surface of the first chip structure is closer to the semiconductor substrate than a second bottom surface of the second chip structure. The method further includes forming an encapsulant layer surrounding the first chip structure and the second chip structure.

In accordance with some embodiments, a package structure is provided. The package structure includes a semiconductor substrate and an interconnection structure over the semiconductor substrate. The package structure also includes a first chip structure bonded to the interconnection structure through dielectric-to-dielectric bonding and metal-to-metal bonding. The package structure further includes a second chip structure bonded to the interconnection structure through solder-containing bonding structures. In addition, the package structure includes an encapsulant layer surrounding the first chip structure and the second chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
providing a semiconductor substrate;
bonding a first chip structure on the semiconductor substrate through metal-to-metal bonding and dielectric-to-dielectric bonding;
bonding a second chip structure over the semiconductor substrate through solder-containing bonding structures; and
forming a protective layer surrounding the second chip structure, wherein a portion of the protective layer is between the semiconductor substrate and a bottom of the second chip structure.

2. The method for forming a package structure as claimed in claim 1, further comprising:
forming an encapsulant layer surrounding the protective layer, the first chip structure, and the second chip structure.

3. The method for forming a package structure as claimed in claim 2, further comprising:
thinning the encapsulant layer so that at least one of the first chip structure and the second chip structure is exposed.

4. The method for forming a package structure as claimed in claim 2, wherein the protective layer is separated from the first chip structure by a portion of the encapsulant layer.

5. The method for forming a package structure as claimed in claim 1, wherein the protective layer further surrounds the first chip structure.

6. The method for forming a package structure as claimed in claim 1, further comprising:
forming a plurality of conductive structures in the semiconductor substrate before the first chip structure and the second chip structure are bonded; and
thinning the semiconductor substrate from a bottom surface of the semiconductor substrate so that the conductive structures are exposed.

7. The method for forming a package structure as claimed in claim 1, further comprising:
forming a plurality of first conductive features and a first dielectric layer over the semiconductor substrate, wherein:
the first dielectric layer surrounds the first conductive feature,
top surfaces of the first conductive features and the first dielectric layer are substantially level,
the first chip structure has a plurality of second conductive features surrounded by a second dielectric layer,
bottom surfaces of the second conductive features and the second dielectric layer are substantially level,
the first dielectric layer is in direct contact with the second dielectric layer, and
the second conductive features are in direct contact with some of the first conductive features.

8. The method for forming a package structure as claimed in claim 1, wherein the first chip structure is bonded on the semiconductor substrate before the second chip structure.

9. The method for forming a package structure as claimed in claim 1, wherein at least one of the first chip structure and the second chip structure has a plurality of semiconductor dies that are bonded together.

10. The method for forming a package structure as claimed in claim 1, further comprising:

forming a plurality of under bump metallization structures over the semiconductor substrate after the bonding of the first chip structure and before the bonding of the second chip structure.

11. A method for forming a package structure, comprising:

providing a semiconductor substrate with an interconnection structure;

bonding a first chip structure directly on the interconnection structure of the semiconductor substrate;

bonding a second chip structure over the interconnection structure of the semiconductor substrate, wherein a first bottom surface of the first chip structure is closer to the semiconductor substrate than a second bottom surface of the second chip structure; and forming an encapsulant layer surrounding the first chip structure and the second chip structure.

12. The method for forming a package structure as claimed in claim 11, further comprising:

bonding the second chip structure to the interconnection structure through tin-containing bonding structures; and forming an underfill structure surrounding the tin-containing bonding structures, wherein a portion of the underfill structure is between the interconnection structure and the second bottom surface of the second chip structure.

13. The method for forming a package structure as claimed in claim 11, wherein the underfill structure does not extend between the interconnection structure and the first bottom surface of the first chip structure.

14. The method for forming a package structure as claimed in claim 11, further comprising:

forming through substrate vias in the semiconductor substrate before the bonding of the first chip structure; and thinning the semiconductor substrate from a bottom surface of the semiconductor substrate to expose the through substrate vias.

15. A package structure, comprising:

a semiconductor substrate;

an interconnection structure over the semiconductor substrate;

a first chip structure bonded to the interconnection structure through dielectric-to-dielectric bonding and metal-to-metal bonding;

a second chip structure bonded to the interconnection structure through solder-containing bonding structures; and an encapsulant layer surrounding the first chip structure and the second chip structure.

16. The chip structure as claimed in claim 15, wherein the first chip structure is closer to the semiconductor substrate than the second chip structure.

17. The chip structure as claimed in claim 15, further comprising:

an underfill structure surrounding the solder-containing bonding structures, wherein a portion of the underfill structure is between the second chip structure and the semiconductor substrate.

18. The chip structure as claimed in claim 15, further comprising:

a plurality of through substrate vias in the semiconductor substrate.

19. The chip structure as claimed in claim 15, wherein top surfaces of the encapsulant layer, the first chip structure, and the second chip structure are substantially level.

20. The chip structure as claimed in claim 15, wherein top surfaces of the first chip structure and the second chip structure are at different height levels.

* * * * *